United States Patent
Chen et al.

(10) Patent No.: US 11,577,980 B2
(45) Date of Patent: *Feb. 14, 2023

(54) COATING ON MOLD FOR GLASS MOLDING AND A PREPARATION METHOD AND APPLICATIONS THEREOF

(71) Applicants: No.59 Institute of China Ordnance Industry, Chongqing (CN); University of Science and Technology Liaoning, Liaoning (CN); Shenzhen University, Shenzhen (CN)

(72) Inventors: Qiang Chen, Chongqing (CN); Zhiwen Xie, Liaoning (CN); Feng Gong, Shenzhen (CN); Xinfang Huang, Liaoning (CN); Kangsen Li, Shenzhen (CN); Yuanyuan Wan, Chongqing (CN)

(73) Assignees: No.59 Institute of China Ordnance Industry, Chongqing (CN); University of Science and Technology Liaoning, Anshan (CN); Shenzhen University, Shenzhen (CN)

( * ) Notice: Subject to any disclaimer, the term of this patent is extended or adjusted under 35 U.S.C. 154(b) by 677 days.

This patent is subject to a terminal disclaimer.

(21) Appl. No.: 16/581,720

(22) Filed: Sep. 24, 2019

(65) Prior Publication Data
US 2020/0331790 A1 Oct. 22, 2020

(30) Foreign Application Priority Data
Apr. 17, 2019 (CN) .......................... 201910309959.6

(51) Int. Cl.
  *C23C 14/02* (2006.01)
  *C03B 19/02* (2006.01)
  (Continued)

(52) U.S. Cl.
  CPC .......... *C03B 19/02* (2013.01); *C23C 14/0036* (2013.01); *C23C 14/022* (2013.01);
  (Continued)

(58) Field of Classification Search
  CPC ............ C23C 14/0036; C23C 14/0676; C23C 14/0641; C23C 14/34; C23C 14/352; C22C 19/055; C22C 38/001
  See application file for complete search history.

(56) References Cited

U.S. PATENT DOCUMENTS 6,372,369 B1 * 4/2002 Ito ........................ C23C 14/0676
  427/523
9,534,961 B2 * 1/2017 Fujita ................... C23C 14/0641
  (Continued)

OTHER PUBLICATIONS

WANG Wang. Development of optical glass precision molding equipment mold [D].2017:1,3-4.
(Continued)

Primary Examiner — Jaehwan Oh

(57) ABSTRACT

Disclosed is a coating made of an organic material on a mold for glass molding. The coating comprises $Cr_xW_yN_{(1-x-y)}$, where $0.15<x<0.4$, and $0.2 \leq y \leq 0.45$. The coating has excellent high temperature resistance and anti-adhesion properties, thus being a promising coating material for molds.

10 Claims, 5 Drawing Sheets

(51) Int. Cl.
*C23C 14/50* (2006.01)
*C23C 14/06* (2006.01)
*C23C 14/35* (2006.01)
*C23C 14/00* (2006.01)

(52) U.S. Cl.
CPC ........ *C23C 14/0641* (2013.01); *C23C 14/352* (2013.01); *C23C 14/505* (2013.01)

(56) References Cited

U.S. PATENT DOCUMENTS

| | | | | |
|---|---|---|---|---|
| 9,625,326 | B2* | 4/2017 | Fujita | C30B 29/38 |
| 9,754,706 | B2* | 9/2017 | Fujita | H01C 17/12 |
| 9,831,019 | B2* | 11/2017 | Fujita | C23C 14/0042 |
| 9,842,675 | B2* | 12/2017 | Fujita | C23C 14/0676 |
| 9,863,035 | B2* | 1/2018 | Fujita | H01C 7/042 |
| 9,903,013 | B2* | 2/2018 | Fujita | C23C 14/3414 |
| 9,905,342 | B2* | 2/2018 | Fujita | G01K 7/22 |
| 10,054,497 | B2* | 8/2018 | Fujita | C23C 14/5826 |
| 2004/0234408 | A1* | 11/2004 | Semba | C22C 38/001 |
| | | | | 420/49 |
| 2005/0170162 | A1* | 8/2005 | Yamamoto | C23C 28/347 |
| | | | | 204/192.15 |
| 2015/0042445 | A1* | 2/2015 | Fujita | H01C 7/041 |
| | | | | 204/192.15 |
| 2015/0049788 | A1* | 2/2015 | Fujita | C30B 25/06 |
| | | | | 204/192.15 |
| 2015/0061820 | A1* | 3/2015 | Fujita | H01C 17/12 |
| | | | | 252/519.12 |
| 2015/0061821 | A1* | 3/2015 | Fujita | H01C 7/008 |
| | | | | 252/519.12 |
| 2015/0315695 | A1* | 11/2015 | Fujita | C23C 14/0641 |
| | | | | 374/185 |
| 2015/0325345 | A1* | 11/2015 | Fujita | C23C 14/3414 |
| | | | | 374/185 |
| 2015/0332817 | A1* | 11/2015 | Fujita | G01K 7/22 |
| | | | | 374/185 |
| 2015/0337433 | A1* | 11/2015 | Fujita | H01C 7/006 |
| | | | | 374/185 |
| 2016/0118165 | A1* | 4/2016 | Fujita | H01C 7/008 |
| | | | | 204/192.21 |
| 2016/0125982 | A1* | 5/2016 | Fujita | C23C 14/0676 |
| | | | | 252/519.12 |
| 2016/0133363 | A1* | 5/2016 | Fujita | H01C 7/006 |
| | | | | 204/192.21 |
| 2016/0187205 | A1* | 6/2016 | Fujita | C04B 35/58042 |
| | | | | 374/185 |
| 2016/0189831 | A1* | 6/2016 | Fujita | C23C 14/5826 |
| | | | | 374/185 |
| 2016/0211059 | A1* | 7/2016 | Fujita | H01C 7/006 |
| 2016/0223407 | A1* | 8/2016 | Fujita | H01C 7/043 |
| 2016/0298764 | A1* | 10/2016 | Ciminelli Duarte De Souza | ........ |
| | | | | F16J 9/26 |
| 2020/0331790 | A1* | 10/2020 | Chen | C23C 14/352 |
| 2020/0331798 | A1* | 10/2020 | Chen | C23C 14/025 |
| 2021/0061702 | A1* | 3/2021 | Chen | C23C 14/352 |

OTHER PUBLICATIONS

Gong Feng, Li Kang-sen, Yan Chao. Progress on precision glass molding[J]. Optics and Precision Engineering, 2018, 26(6): 1380-1381.

Wei Yu-ping, Chen Yong. Development and Application of Glass Mold Materials[J]. Mechanical Design and Manufacturing, 2008(3):201.

Xiao Ming. Development and Application of New Glass Mold Materials [J]. Glass and Enamel, 2006, 34(2):19.

Chen Mingfa. Discussion on the Characteristics and Development of Glass Mould Materials[J]. Mould Manufacturing, 2011(11): 81.

* cited by examiner

COATING ON MOLD FOR GLASS MOLDING AND A PREPARATION METHOD AND APPLICATIONS THEREOF

CROSS-REFERENCE TO RELATED APPLICATIONS

This application claims the benefit of priority from Chinese Patent Application No. CN201910309959.6, filed on Apr. 17, 2019. The content of the aforementioned application, including any intervening amendments thereto, is incorporated herein by reference in its entirety.

TECHNICAL FIELD

This application relates to coatings made of inorganic materials on molds for glass molding, and more particularly to a coating on a mold for glass molding, and a preparation method and application thereof.

BACKGROUND OF THE INVENTION

The development of manufacturing techniques brings a wider application of optical elements in defense and military and aerospace industry and for civil use. For example, various optical elements are adopted in satellite monitoring systems, infrared night-vision imaging, laser radiation, fiber optical communications, projectors, digital cameras and surveillance cameras, etc., and thus the manufacture of optical elements of high precision, high quality and high performance is in great demand in advanced manufacturing (Wang Wang, Development of Molds for Precision Optical Glass Molding, A master's thesis, Shenzhen University, 2017, page 1, publication date: Dec. 31, 2017; Feng Gong et al., Development of Precision Glass Molding, *Optics and Precision Engineering*, 2018, 26 (6), page 1380-1381, publication date: Jun. 30, 2018).

In recent years, optical elements worldwide have an average annual growth rate of more than 20%, reaching tens of billions of dollars. The optical elements are almost applied to all fields of human life, such as cameras, zoom lenses, projectors, wide-angle infrared artificial horizons, CD-ROM disk drives, endoscopes and progressive lenses, etc. There are higher requirements for the physical and chemical performances, apertures, processing precision, processing efficiency and cost of the optical elements, so that these instruments have good imaging quality, compact and simple structures and suitable applications in various environments. Traditional precision grinding, ultra-precision turning and magnetorheological compound finishing, etc. have defects in terms of cost, processing efficiency and mass production, etc. The resin injection molded lenses have poor performances in refractive index and heat stability, etc. Precision glass molding overcomes above defects and has the advantages of high precision, low cost, high efficiency and being net-shape forming and non-pollution, etc. (Feng Gong et al., Development of Precision Glass Molding, Optics and Precision Engineering, 2018, 26(6), page 1380-1381, publication date: Jun. 30, 2018).

The main principle of precision thermoforming of the optical glass is to utilize different physical properties of the optical glass at different temperatures. The glass is hard and brittle at room temperature, but it is viscoelastic or has physical properties of viscous fluid (as shown in FIG. 1) at high temperature, so the optical glass will change from a solid state to a plastic state in a certain temperature range, and the transition temperature is Tg, referred to as the yield point. When the temperature continues to rise to a certain point Sp, referred to as the softening point, the glass will exhibit the properties of fluids. Based on such characteristic of glass, after the optical glass is heated to an appropriate temperature above the transition temperature Tg, the glass molding copies shapes of the mold onto the preformed glass by moving upper and lower molds (Wang Wang, Development of Molds for Precision Optical Glass Molding, A master's thesis, Shenzhen University, 2017, p3-4, publication date: Dec. 31, 2017).

However, in the molding process of glass products, the mold suffers oxidation, thermal fatigue and dynamic wear, etc. due to frequent contacts between the molten glass of high temperature and the mold (Yuping Wei etc., Development and Application of Mold Materials for Glass Molding, *Machinery Design & Manufacture,* 2018(3), page 201, publication date: Mar. 31, 2008; Ming Xiao, Development and Application of Mold Materials for High-tech Glass Molding, *Glass & Enamel,* 2006, 34(2), page 19, publication date: Apr. 30, 2006). This requires the mold materials to have good heat, abrasion, corrosion, thermal shock, oxidation, thermal fatigue resistances and the like. At the same time, the mold materials should be dense and easy to process, and have good heat conduction and low heat expansion coefficient (Mingfa Chen, Discussion on Characteristics and Development of Mold Materials for Glass Molding, *Die & Mold Manufacture,* 2011 (11), page 81, publication date: Dec. 31, 2011).

Currently, the traditional methods, such as turning and grinding, are still adopted for preparing glass elements with complex shapes in China. Such methods have low efficiency, high cost and are difficult to control the precision of the glass elements. Moreover, coatings of diamond-like carbon (DLC) and carbon nanotubes, etc. on the molds for glass molding are only suitable for optical glass with low melting point because they cannot endure excessive temperatures.

Therefore, a novel coating on molds for glass of high temperature resistance and anti-adhesion properties is urgently required in production to prolong the service life of the glass-forming mold and improve the molding quality of the optical glass.

SUMMARY OF THE INVENTION

In view of this, the present invention aims to provide a coating on molds for glass molding, which has good performance in high temperature resistance and anti-adhesion properties.

The present invention adopts the following technical solutions to achieve above object.

A coating on a mold for glass molding, wherein the coating comprises $Cr_xW_yN_{(1-x-y)}$, wherein $0.15<x<0.4$, and $0.2 \leq y \leq 0.45$.

Further, the coating comprises a CrN columnar crystal.

Further, the coating has a thickness of 1.4-1.8 μm.

In a second aspect, the present invention aims to provide a method for preparing the coating, comprising:

A: performing sputter cleaning on a substrate and a target in a vacuum or an inert gas;

B: depositing the coating on a surface of the substrate treated in step A by a Cr target and a W target in a vacuum or an inert gas.

Further, the inner gas is one of argon and nitrogen or a mixture thereof.

Further, the coating is deposited via plasma-enhanced magnetron sputtering.

Further, the method for preparing the coating comprises: before step A, 1) polishing the substrate; and
2) ultrasonically cleaning the polished substrate in deionized water and/or acetone and/or ethanol.

Further, in step A, during the sputter cleaning, the inert gas as a working atmosphere is argon with a flow rate of 100-180 sccm; a vacuum degree of the vacuum is 0.2-0.6 Pa; the substrate is preheated to 200-400° C., such as 300-400° C.; the coating is deposited at a bias voltage of −30-−100 V; a time for sputter cleaning of the substrate is 30-120 minutes, such as 60-120 minutes; and a time for sputter cleaning of the target is 1-5 minutes, such as 2-5 minutes.

Further, in step B, during the sputter cleaning, the inert gas as a working atmosphere is nitrogen with a flow rate of 60-120 sccm; a vacuum degree of the vacuum is 0.2-0.6 Pa; the substrate is preheated to 200-400° C.; the coating is deposited for 60-100 minutes at a bias voltage of −30-−70 V; a power of the Cr target is 2-5 kW, and a power of the W target is 4-8 kW.

Further, in step B, the substrate rotates with a rotating stage of the magnetron sputtering system in the step of depositing the coating on the substrate surface.

Further, the magnetron sputtering system comprises a vacuum chamber, the rotating stage which is rotatable and is provided in the vacuum chamber, and target materials provided around the rotating stage, where the target materials comprise the Cr target and the W target.

In a third aspect, the present invention aims to apply the coating to the preparation of a mold for glass molding.

In a fourth aspect, the present invention aim to provide a mold for glass molding, comprising a coating comprising $Cr_xW_yN_{(1-x-y)}$, wherein $0.15<x<0.4$, and $0.2\leq y<0.45$.

The present invention has the following beneficial effects.

Clusters with different sizes, fine cracks and pores are distributed on the coating surface. The cross section of the coating is columnar, and the coating and the substrate are closely combined.

The coating of the present invention with good mechanical properties reaches the hardness standard for the coating on molds for glass molding.

The coating of the invention is low in surface roughness exhibiting good surface finishing, which is suitable for the coating on molds for the precision glass molding.

The coating of the invention can meet the requirements of precision molding of optical glass. After the molding, the glass and the surface of the mold coating have no significant changes. Specifically, the color of the glass is not changed and no bubble is generated, and the mold surface has no scratches and adhered glass.

The coating of the invention has a strong wettability for resisting droplets of molten glass, so it is less prone to adhesion.

DETAILED DESCRIPTION OF EMBODIMENTS

Figure 1:
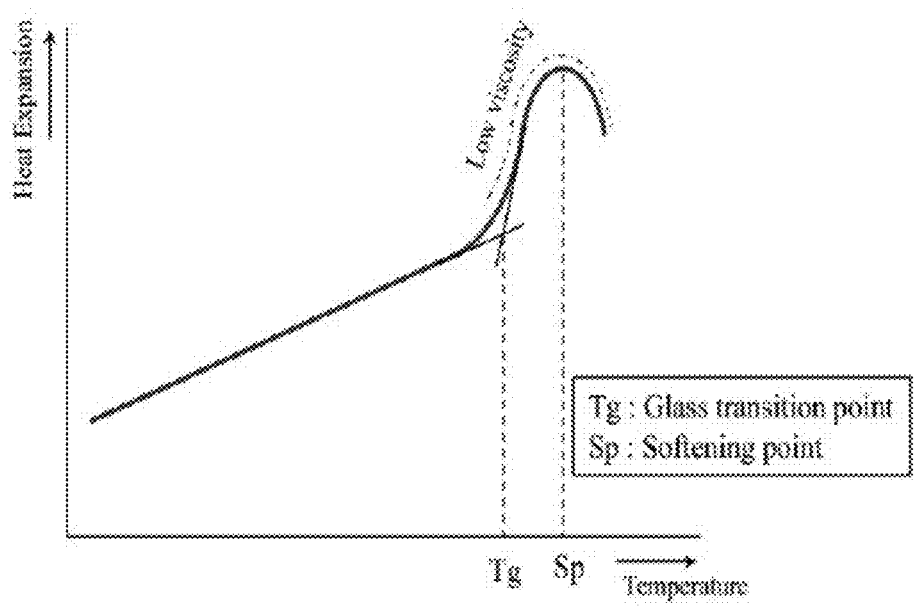
FIG. 1 is a temperature-volume graph of optical glass.

The embodiments are intended to better illustrate but not to limit the present invention. Therefore, non-substantial improvements and adjustments to the embodiments based on above-mentioned inventions by those skilled in the art shall fall within the scope of the present invention.

Example 1

A preparation method for a coating on molds for glass molding comprises the following steps.

1) The substrate is mechanically ground and polished, and then is ultrasonically cleaned in deionized water, analytical acetone and analytical ethanol in turn for 20 minutes, respectively. Then the sample is dried in an oven at 80° C. for 30 minutes.

2) The sample is placed in a vacuum chamber which is pre-vacuumized. The vacuum of the substrate is $5\times10^{-3}$ Pa, and at the same time, the vacuum chamber is heated to 300° C.

3) A substrate and a target are performed sputter cleaning in a vacuum or argon which is an inert gas. During the sputter cleaning, the working atmosphere is argon with a flow rate of 120 sccm, and a vacuum degree of the vacuum is 0.5 Pa. The substrate is preheated to 300° C. The coating is deposited at a bias voltage of −100 V. A time for the sputter cleaning of the target is 5 minutes.

4) The coating comprising $Cr_xW_yN_{(1-x-y)}$ is coated on the substrate by the magnetron method using a high-purity (99.9%) Cr target and a high-purity (99.6%) W target. During sputter cleaning, the working atmosphere is a mixture of nitrogen with a flow rate of 100 sccm and argon with a flow rate of 100 sccm, and a vacuum degree of the vacuum is 0.4 Pa. The substrate is preheated to 300° C. The coating is deposited for 100 minutes at a bias voltage of −50 V. A power of the Cr target is 2.7 kW and a power of the W target is 4 kW. The substrate rotates with a rotating stage of the magnetron sputtering system in the step of depositing the coating on the substrate surface. The magnetron sputtering system comprises a vacuum chamber, the rotating stage which is rotatable and is provided in the vacuum chamber, and target materials provided around the rotating stage.

The coating in the first embodiment is tested in terms of performance such as morphologies of surface and cross section of the coating, hardness, surface roughness, surface elements, phase compositions and wetability at high temperature, and the results are shown in FIGS. 2-8.

The morphologies of surface and cross section of the coating are observed by field emission scanning electron microscope (FESEM).

The hardness of the coating is tested by nanoindentors using the continuous stiffness measurement (CSM). The depth of nano-indentation is set to 110 nm so as to eliminate the substrate factor on the test result. Five different areas on the sample are selected for testing, and then the hardness and elastic modulus are averaged, so that the accuracy and reliability of the data are ensured.

The roughness of the surface of the coating is tested by an atomic force microscope, and the sample area to be tested is 2×2 μm.

The molding pressure is tested by molding the BK7 optical glass using the self-designed mold for optical non-spherical glass molding (Chinese Patent Application No. 201710124489.7; Chinese Patent Publication No. 106946441 A), where the molding pressure is 0.5 kN; and the molding temperature is 650° C. The morphologies and colors of the glass and the coating on the mold are observed.

Elements of the coating surface are tested via qualitative analysis using X-ray energy dispersive spectrometer (EDS) of the field emission scanning electron microscope (FE-SEM).

Phase structure of the coating is tested by an X-ray diffractometer, and the crystal structure of the coating is analyzed with small angle diffraction to avoid the factor of the substrate.

Through a high-temperature wetting test, the wettability of the coating at high temperature is examined at a temperature of 1000° C. by using a modified sessile drop method, where the vacuum is $5 \times 10^{-3}$ Pa, and the glass is BK7 optical glass.

Figure 2A:
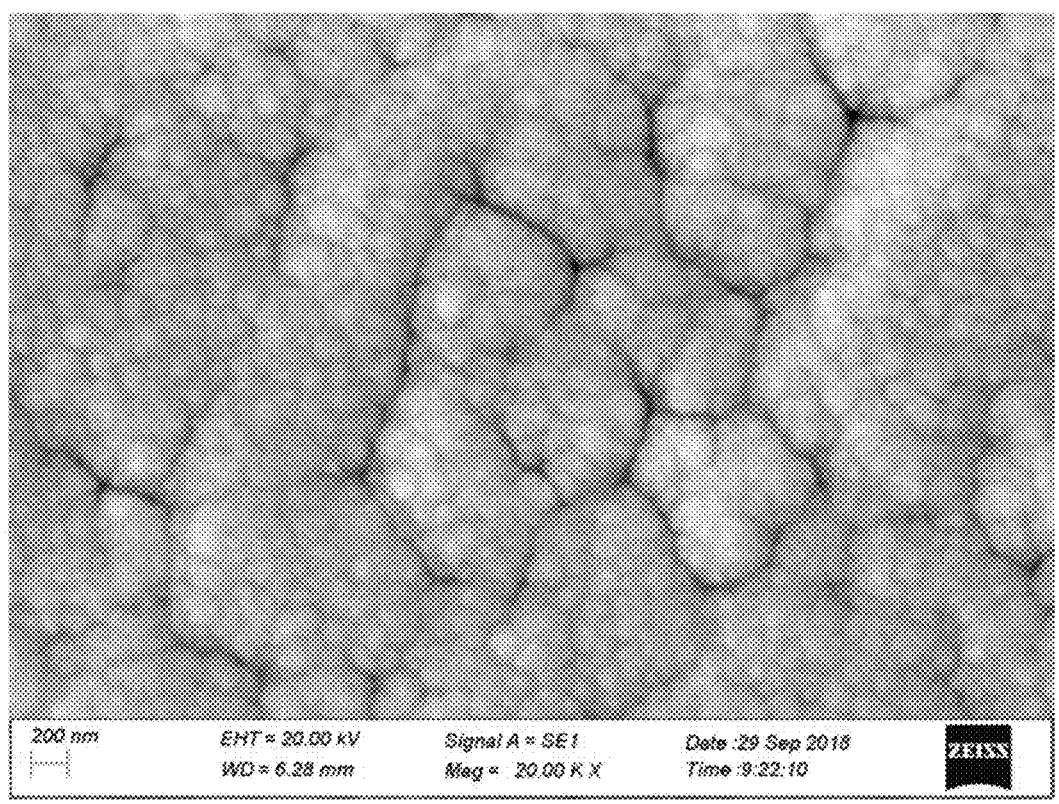
FIGS. 2A-2B are SEM images showing a surface and a cross section of a coating according to a first embodiment.
Figure 2B:
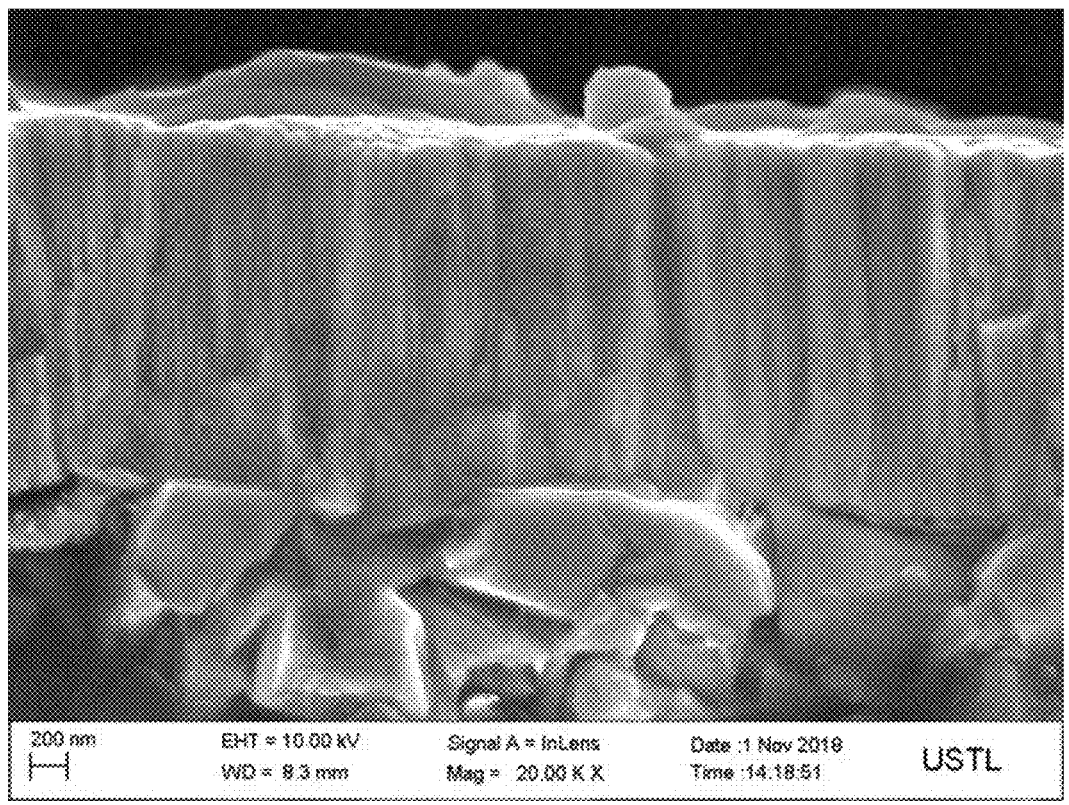

As shown in FIGS. 2A-B, clusters with different sizes, fine cracks and pores are distributed on the coating surface. The morphology of cross section of the coating is in a column structure, and the coating with a thickness of 1.76 μm are closely combined with the substrate.

Figure 3:
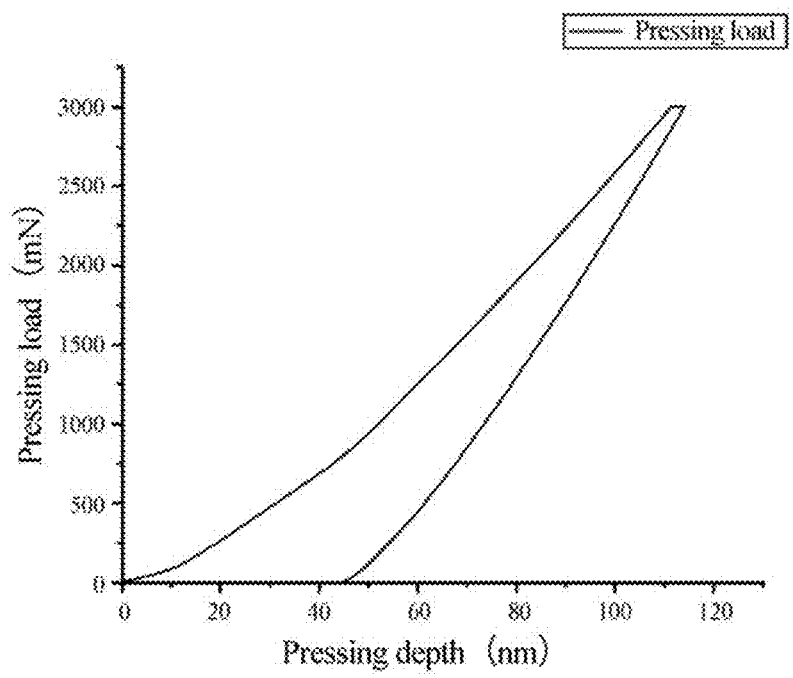
FIG. 3 shows a test result of hardness of the coating according to the first embodiment.

As shown in FIG. 3, the coating prepared in Example 1 has a hardness of 12.9 GPa. Thus, the coating of the invention with good mechanical properties reaches the hardness standard for the coating on molds for glass molding.

Figure 4:
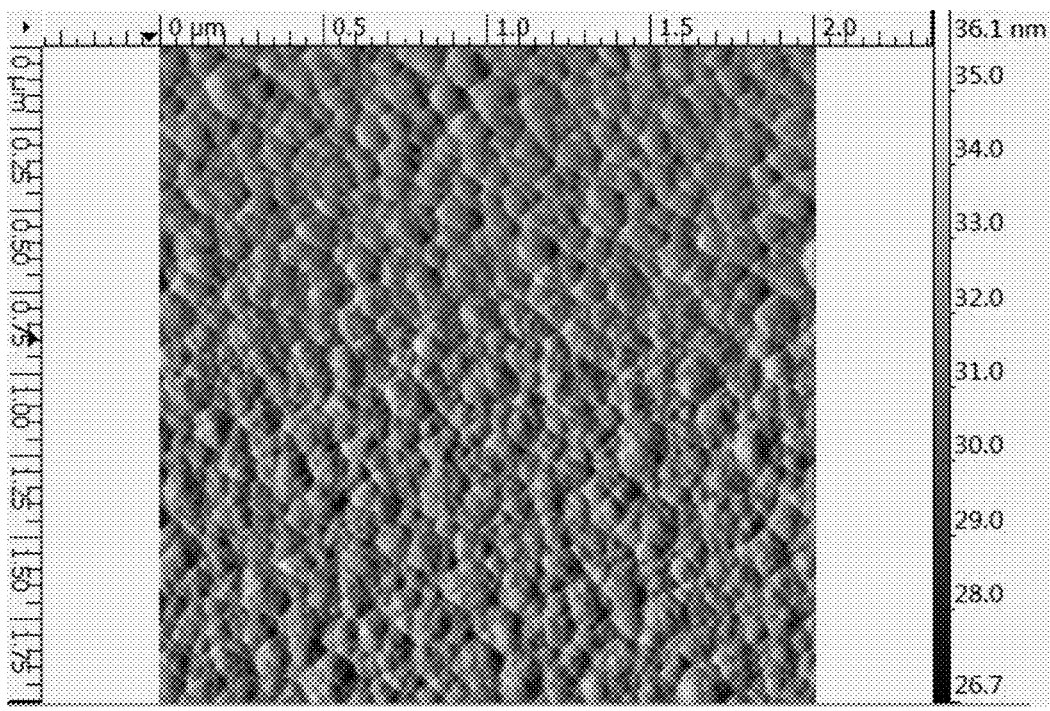
FIG. 4 shows a test result of surface roughness of the coating according to the first embodiment.

As shown in FIG. 4, the coating prepared in Example 1 has a surface roughness of 13.8 nm exhibiting good surface finishing, and is suitable for the coating on molds for precision glass molding.

Figure 5:
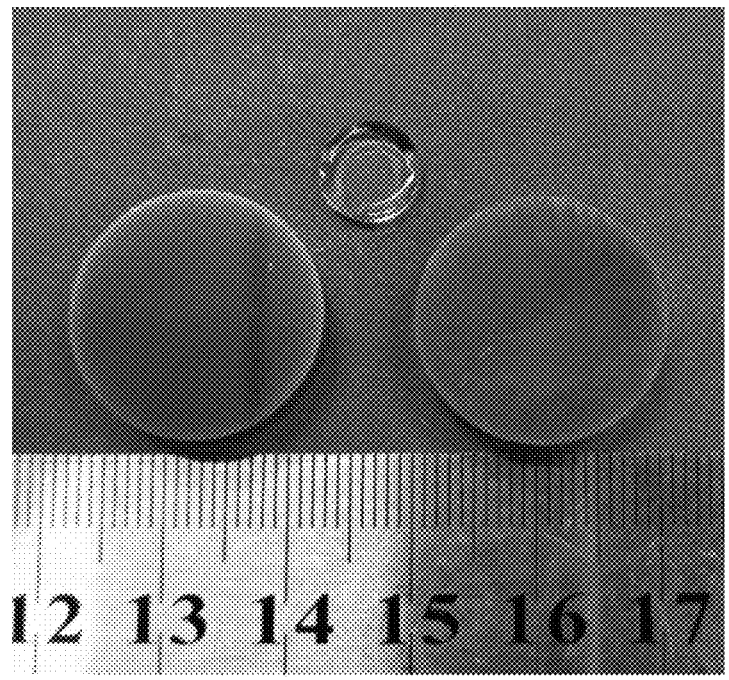
FIG. 5 is an image showing morphologies of surfaces of the coating and glass according to the first embodiment, in which the glass has been molded.

As shown in FIG. 5, after the molding, no significant change is observed on the glass and the coating surface. Further, the color of the glass is not changed and no bubble is generated, and the mold surface has no scratches and glass adhered thereto. It is demonstrated that the coating of the invention can meet the requirements of precision optical glass molding.

Figure 6:
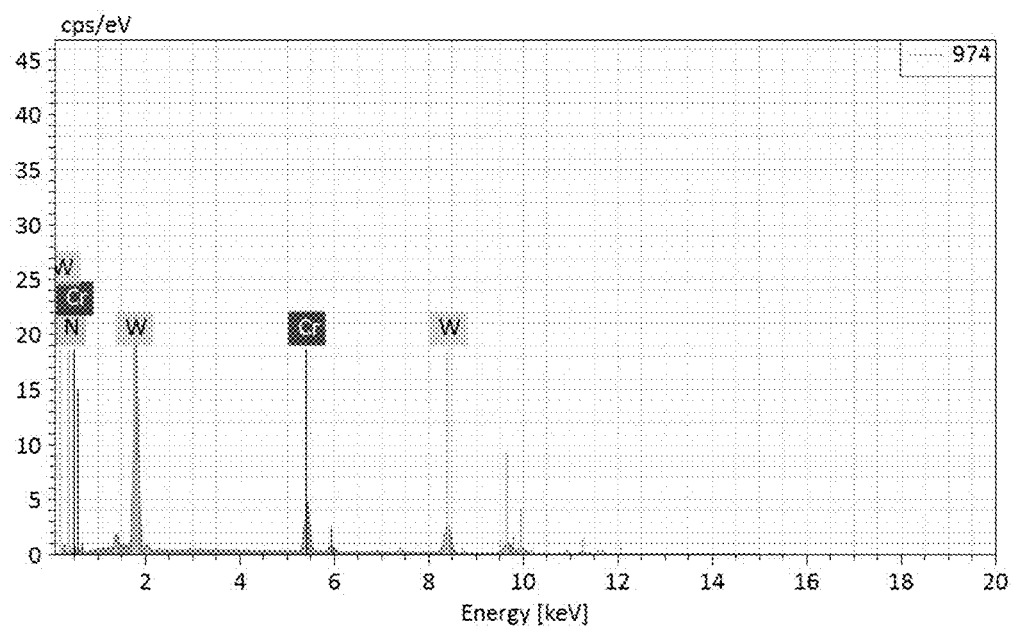
FIG. 6 shows an XRD result of elements of a surface of the coating according to the first embodiment.

As shown in FIG. 6, the coating prepared in Example 1 are mainly composed of Cr, W and N.

Figure 7:
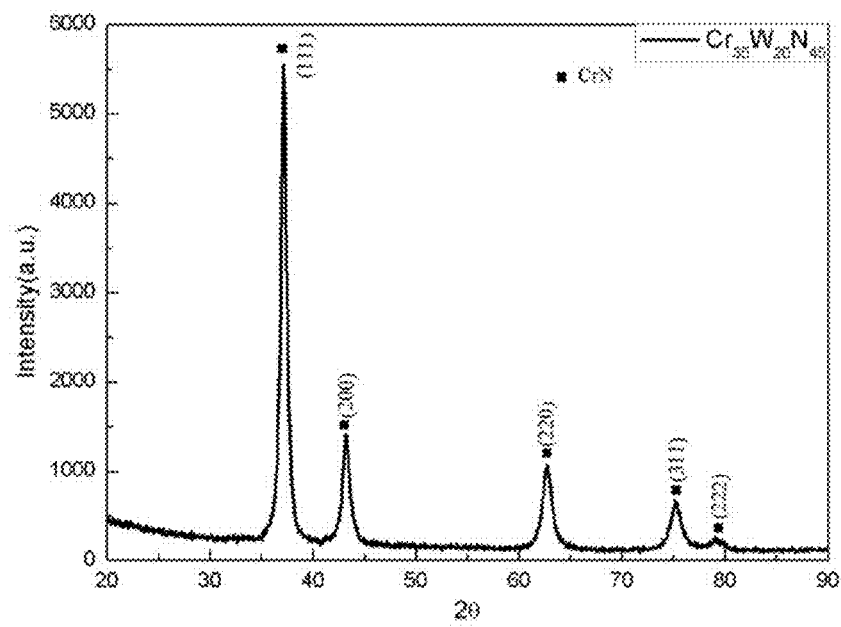
FIG. 7 shows a test result of a phase composition of the coating according to the first embodiment.

As shown in FIG. 7, the coating prepared in Example 1 mainly has a stable CrN phase. A columnar CrN crystal can be observed in the cross-section SEM image, with (110), (200), (220), (311) and (222) orientations. Mass fractions of the Cr, W and N elements in the coating are 35%, 20% and 45%, respectively.

Figure 8:
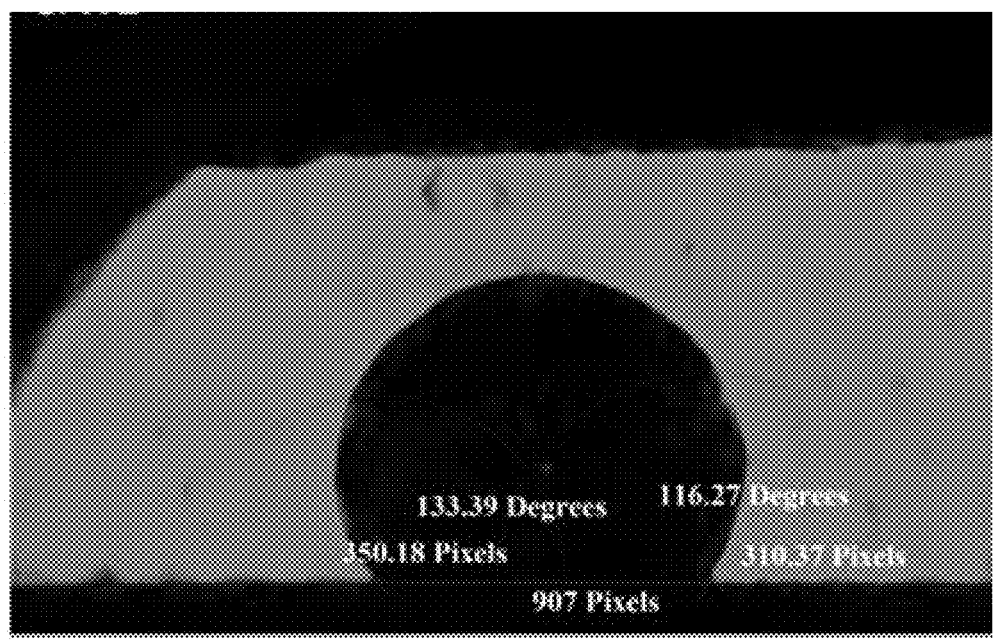
FIG. 8 shows a test result of wetability of the coating at high temperature according to the first embodiment.

As shown in FIG. 8, when the coating prepared in Example 1 is exposed to an ambient temperature of 1000° C. and a vacuum of $5 \times 10^{-3}$ Pa, contact angles between the molten glass and the coating at high temperature are 116° and 133°, so a significant asymmetry occurs at left and right sides of the droplet. Therefore, the coating of the invention has a good wettability for resisting droplets of the molten glass, so it is less prone to adhesion.

It should be understood that although the embodiments are illustrated in the description for clarity, each embodiment may include more than one technical solution. It is noted that the description should be taken as a whole, and various embodiments can be appropriately combined to form other embodiments that can be understood by those skilled in the art.

We claim:

1. A coating on mold for glass molding, wherein the coating comprises $Cr_xW_yN_{(1-x-y)}$, wherein $0.15<x<0.4$, and $0.2 \leq y \leq 0.45$.

2. The coating of claim 1, wherein the coating comprises a CrN columnar crystal.

3. The coating of claim 1, wherein the coating has a thickness of 1.4-1.8 μm.

4. A method for preparing the coating of claim 1, comprising:
   A: performing sputter cleaning on a substrate and a target in a vacuum or an inert gas; and
   B: depositing the coating on a surface of the substrate treated in step A with a Cr target and a W target in a vacuum or an inert gas.

5. The method of claim 4, wherein in step A, during the sputter cleaning, the inert gas as a working atmosphere is argon with a flow rate of 100-180 sccm, and a vacuum degree of the vacuum is 0.2-0.6 Pa; the substrate is preheated to 200-400° C.;
   the coating is deposited at a bias voltage of −30∼−100 V; a time for sputter cleaning of the substrate is 30-120 minutes; and a time for sputter cleaning of the target is 1-5 minutes.

6. The method of claim 4, wherein in step B, during the sputter cleaning, the inert gas as a working atmosphere is nitrogen with a flow rate of 60-120 sccm; a vacuum degree of the vacuum is 0.2-0.6 Pa; the substrate is preheated to 200-400° C.; the coating is deposited for 60-100 minutes at a bias voltage of −30∼−70 V; a power for the Cr target is 2-5 kW, and a power for the W target is 4-8 kW.

7. The method of claim 4, wherein in step B, the substrate rotates with a rotating stage of a magnetron sputtering system in the step of depositing the coating on the surface of the substrate.

8. The method of claim 7, wherein the magnetron sputtering system comprises a vacuum chamber, the rotating stage which is rotatable and is provided in the vacuum chamber, and a target provided around the rotating stage, wherein the target comprise Cr and W.

9. An application of the coating of claim 1, comprising applying the coating to the preparation of a mold for glass molding.

10. A mold for glass molding, comprising a coating which comprises $Cr_xW_yN_{(1-x-y)}$, wherein $0.15<x<0.4$, and $0.2 \leq y \leq 0.45$.

* * * * *